US006898562B2

(12) United States Patent
Hoffman

(10) Patent No.: US 6,898,562 B2
(45) Date of Patent: May 24, 2005

(54) METHOD AND SYSTEM FOR EFFICIENTLY OVERRIDING NET VALUES IN A LOGIC SIMULATOR MACHINE

(75) Inventor: Harrell Hoffman, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 890 days.

(21) Appl. No.: 09/732,264

(22) Filed: Dec. 7, 2000

(65) Prior Publication Data

US 2002/0072888 A1 Jun. 13, 2002

(51) Int. Cl.[7] .............................. G06F 3/00; G06F 17/00
(52) U.S. Cl. ............................. 703/15; 703/22; 714/47
(58) Field of Search ............................. 703/15, 22, 23, 703/28, 27; 710/21; 716/16; 714/47, 733, 724; 324/528

(56) References Cited

U.S. PATENT DOCUMENTS

| | | | |
|---|---|---|---|
| 4,306,286 A | 12/1981 | Cocke et al. ............... 364/200 |
| 4,862,347 A | 8/1989 | Rudy ......................... 364/200 |
| 4,914,612 A | 4/1990 | Beece et al. ................ 364/578 |
| 5,317,711 A | 5/1994 | Bourekas et al. ........... 395/425 |
| 5,327,361 A * | 7/1994 | Long et al. .................... 703/15 |
| 5,548,785 A * | 8/1996 | Fogg et al. .................... 710/21 |
| 5,734,869 A * | 3/1998 | Chen ............................. 703/15 |
| 5,878,208 A | 3/1999 | Levine et al. .......... 395/183.14 |
| 5,937,179 A * | 8/1999 | Swoboda ...................... 716/16 |
| 6,061,511 A * | 5/2000 | Marantz et al. ............... 703/28 |
| 6,618,698 B1 * | 9/2003 | Beausoleil et al. ........... 703/23 |

* cited by examiner

Primary Examiner—Thai Phan
(74) Attorney, Agent, or Firm—Duke W. Yee; Robert M. Carwell; Stephen J. Walden, Jr.

(57) ABSTRACT

A method and system are described in a logic simulator machine for overriding a value of a net during execution of a test routine. A model of a logic design to be simulated is built utilizing the logic simulator machine. The logic design includes multiple nets. One of the nets whose actual value may be overridden is selected. A multiplexer is inserted into the model. The multiplexer receives as its inputs the actual value of the selected net, a control bit, and an override value bit. An override value is input into the multiplexer using the override value bit. The multiplexer outputs a current value of the selected net. The current value is thus propagated to other nets. The override value is propagated as the current value of the net instead of the net's actual value throughout execution of the test routine when the multiplexer control bit is set.

12 Claims, 3 Drawing Sheets

METHOD AND SYSTEM FOR EFFICIENTLY OVERRIDING NET VALUES IN A LOGIC SIMULATOR MACHINE

BACKGROUND OF THE INVENTION

1. Technical Field

The present invention relates in general to apparatus and methods for efficiently overriding net values in a logic simulator machine. More particularly, the present invention provides apparatus and methods for overriding net values in a logic simulator machine by inserting a multiplexer into a model for each net whose value can then be overridden.

2. Description of Related Art

Logic circuits in computer systems and related products have become increasingly large and complex. As a result, the initial design and fabrication have become increasingly more lengthy and costly. Although many efforts are made to eliminate any errors, it is no longer feasible to test the design only after the circuit has been fabricated. Accordingly, in recent years there has been increasing effort in design verification using computer modeling of the logic circuits before the circuit is actually embodied in hardware. The errors being referred to here are those produced by the interaction of logic circuits which are assumed to be operating correctly as separate entities but which are producing poor or incorrect results when operating together.

Logic technologies such as very large scale integrated circuits provide significant improvements in cost, performance, and reliability. However, they have disadvantages in that their fault diagnosis is more difficult than previous technologies and their engineering rework cycles needed to correct faults in logic design are greatly lengthened. These disadvantages exact great economic penalties for design errors and omissions and place a great emphasis on the goal of completely verifying designs in advance of engineering models.

Simulation has become a central part of verification methodology for circuit design. Applications span a wide spectrum, from early specifications to explore different architectural possibilities to the final stages of manufacturing test generation and fault coverage evaluation. For a long time, computer programs for use on a general purpose computer have been known which simulate such logic circuits. In these systems, the software program is run on any suitable general purpose computer. A model of the logic design is created. Test software programs may then be developed and executed using the model to analyze the operation of the logic design. However, as the number of gates on a single chip have reached into the range of hundreds of thousands to millions, these purely software simulators have required excessive amounts of computer time.

One approach used to overcome the excessive resource problem for full system simulation has been to build a hardware model of the design, essentially by hand wiring circuit boards with discrete components. Once wired, the circuit very quickly can emulate the desired circuit. A hardware emulator is a device which physically takes the place of the device to be emulated. A logic simulator machine, described below, could also act as a hardware emulator when the logic simulator machine is executing a model of the design if the appropriate wiring is attached to the logic simulator machine which will permit it to be physically coupled to other devices. However, a hardware model itself is costly and time consuming to build.

Another approach, which has found widespread acceptance, is a specialized logic simulator machine. These logic simulator machines as also sometimes called hardware accelerators. There are numerous logic simulation machines in existence for simulation, with different capacity, performance, and applications. These logic simulation machines range from small systems to significantly larger machines for simulating millions of gates. The term "logic simulator machine" as used herein will mean a hardware-based machine, and not a software-based simulation engine as described above.

One such logic simulator machine is described by U.S. Pat. No. 4,306,286 issued Dec. 15, 1981 to Cocke et al. This patent is herein incorporated by reference. The purpose of the logic simulator machine is to detect design errors in a simulated logic and enable the logic designer to correct the errors before the manufacture of the design.

The logic simulator machine described by Cocke et al. comprises a plurality of parallel basic processors which are interconnected through an inter-processor switch. The inter-processor switch provides communication not only among the basic processors which are the computing engine of the logic simulator machine, each simulating the individual gates of a portion of a logic model in parallel, but also between them and a control processor which provides overall control and input/output facilities of the logic simulator machine through a host computer to which the control processor is attached. Each basic processor contains the current state information for only the set of gates that is being simulated by that processor. When a basic processor simulates a gate whose input includes a connection to the output of a gate being simulated by a different processor, the state information for the gate is transferred over the inter-processor switch.

A representation of a logic design is first created in which Boolean gates, such as AND or OR gates, are used. A model of this representation is then built which may then be executed by the logic simulator machine. Test routines to test the design then may be executed using the model of the design which is being executed by the logic simulator machine.

A logical representation of a model which may be executed by a logic simulator machine is illustrated in FIG. 1 in accordance with the prior art. The numbers near the gates are the locations in instruction memory included in the logic simulator machine of the instructions representing the gates. They are also the locations in the current and next signal memory in the logic simulator machine holding the simulated gate outputs. These locations are also typically referred to as "nets". Inputs are assumed to come from locations 5 and 6.

The logical representation of FIG. 1 includes a NAND gate 10 which receives a net 5 and a net 6 as its inputs. NAND 10 outputs a net 1 which is propagated to both NAND 12 and NAND 14 as an input. NAND 12 also receives net 5 as an input. NAND 14 also receives net 6 as an input. NAND 12 outputs net 2 as its output which is propagated to NAND 16 as an input. NAND 14 outputs net 3 as its output which is propagated to NAND 16 as an input. NAND 16 outputs net 4.

In order to test the circuit of FIG. 1 using a logic simulator machine, a model of the circuit is built. A test routine then may be executed using the model being executed by the logic simulator machine.

It may be useful when testing a circuit design to override a particular net while the test routine is being executed. One method in the prior art to override a net value was to replace the original function with an override function in the function memory. The override function will cause the override value to always be output for the net. For example, in the prior art, to override the current value of net 3, the original NAND function is replaced with an override function which will always output the override value for net 3. In the model for the circuit of FIG. 1, each NAND function is stored in function memory in the logic simulator machine. Each NAND function may be represented by a large number of bits. For example, in some systems, it may take from between 16 to 64 bits to represent a function. In order to override one NAND function, the model is modified by storing an override value in the function memory in place of the NAND function. The test routine is then executed using this modified model of the circuit. When the net is no longer to be overridden, the original function must then be stored back in function memory. In this example, the NAND function must be stored back in its appropriate function memory.

This process is repeated for each net value to be overridden. Often, many nets will need to be overridden for one or more cycles of execution of the test routine. It becomes very time consuming to store an override value, execute the test routine, and then restore the original function for each net, particularly when hundreds of nets may be overridden.

Therefore, a need exists for a method and system for efficiently overriding net values in a logic simulator machine.

SUMMARY OF THE INVENTION

A method and system are described in a logic simulator machine for overriding a value of a net during execution of a test routine. A model of a logic design to be simulated is built utilizing the logic simulator machine. The logic design includes multiple nets. One of the nets whose actual value may be overridden is selected. A multiplexer is inserted into the model. The multiplexer receives as its inputs the actual value of the selected net, a control bit, and an override value bit. An override value is input into the multiplexer using the override value bit. The multiplexer outputs a current value of the selected net. The current value is thus propagated to other nets. The override value is propagated as the current value of the net instead of the net's actual value throughout execution of the test routine when the multiplexer control bit is set.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
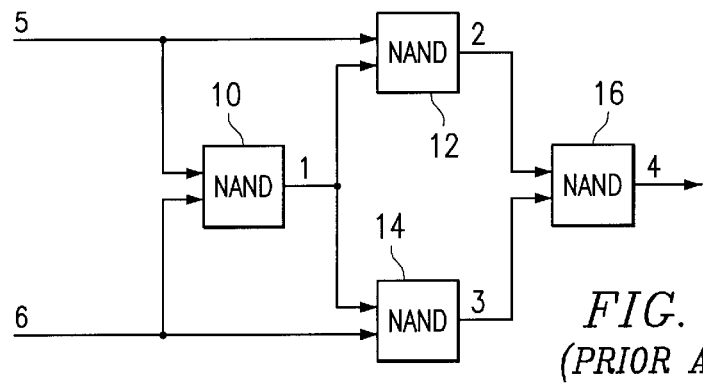
FIG. 1 illustrates a logical representation of a model according to the prior art.

A preferred embodiment of the present invention and its advantages are better understood by referring to FIGS. 1–6 of the drawings, like numerals being used for like and corresponding parts of the accompanying drawings.

The present invention is a method and system in a logic simulator machine for overriding net values. One or more nets in a logic design are selected. These are the nets which might need to be overridden during execution of a test routine. When a model of the logic design is built using the logic simulator machine, a multiplexer is added to the model for each selected net. Each multiplexer has a control bit input, an override value bit input, and the actual value of the net as an input. The output of the multiplexer is connected to other nets to propagate its output in place of the actual net value. When the actual net value is overridden, the multiplexer will output and propagate an override value. When the actual net value is not overridden, the multiplexer will output and propagate the actual net value.

When a net is to have its actual value overridden, the control bit input of the net's multiplexer is set in order to cause the multiplexer to select the override value bit input as the output of the MUX. An override value is also selected and input into the MUX using the override value bit. The override value is the value the test engineer has chosen to propagate to the other nets in place of the actual net value. After a net is overridden, when the test engineer decides to have the actual net value propagated as the current value of the net instead of the override value, the control bit input to the net's MUX is cleared. When the control bit input is cleared, the MUX will select the actual value of the net to output and propagate to the other nets.

In this manner, once a model is built, a net may be overridden by inputting only two bits into the model. It is no longer necessary to input a larger number of bits in order to replace an overridden function as was necessary in the prior art.

In addition, the bits to input to override a net may all be stored in contiguous memory. Therefore, a block write may be performed in order to store all or a large portion of the control bit and override bit values in the model. This advantage of the present invention becomes more apparent when many nets need to be overridden. For example, if there are 200 nets in a model to be overridden, data for 400 bits must be copied into the model to set the multiplexers correctly. Using the present invention, the data for the 400 bits may be stored in contiguous memory in the model. Therefore, the 400 bit data may be copied into the model using a block write command.

In the prior art, the function for each of the 200 nets must be replaced by an override function. The override functions will be copied into 200 different locations which are not in contiguous memory locations in the model. Therefore, up to 200 different write commands must be performed to copy the override functions.

Figure 2:
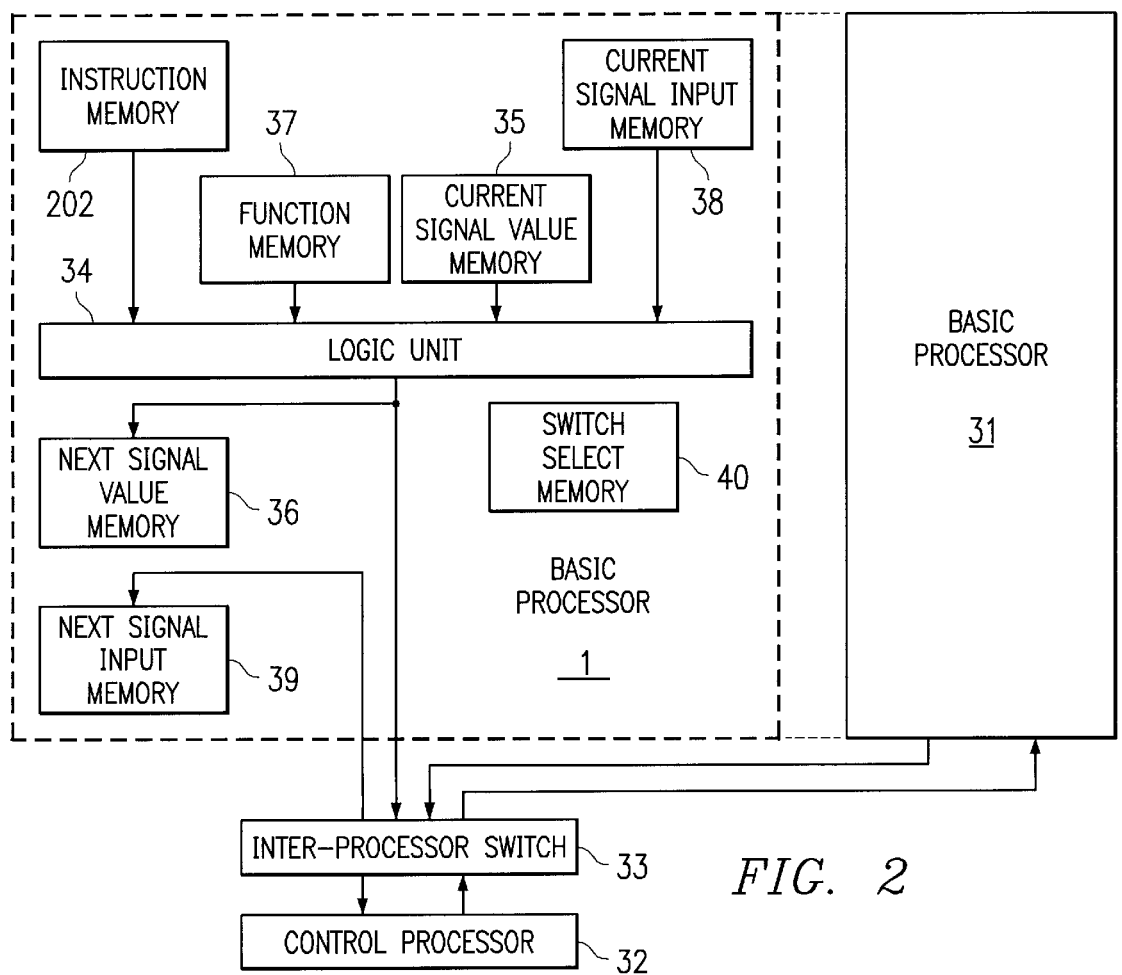
FIG. 2 depicts a logic simulator machine which is capable of executing the present invention.

FIG. 2 depicts a logic simulator machine which is capable of executing the present invention. The logic simulator machine includes a plurality of basic processors, the number of which may vary. The basic processors are connected to a control processor through an inter-processor switch. The basic processors are the computing engines of the logic simulator machine. They simulate the individual gates of the logic design. All of the basic processors run in parallel, each simulating a portion of the logic. Because the basic processors run in parallel, increasing their number does not decrease the simulation rate, and may be used to increase it.

Since the logic simulator machine is not a general purpose computer, it must be used as a device attached to a computer which can perform for it functions such as compilation, input/output control, etc.

There is one control processor. It provides overall control and input/output facilities. The control processor performs the functions of starting and stopping the basic processors, loading the basic processors with instructions and data, and transferring input and output data between the basic processors and the general purpose computer to which the logic simulator machine is connected. In addition, the control processor interrupts the general purpose processor in response to events occurring during the simulation.

As illustrated in FIG. 2, each basic processor such as processor 1 has a plurality of internal memories with a logic unit 34 connecting them. Two of these memories are two identical logic data memories which alternately assume one of two roles; that of the current signal value memory 35 and that of the next signal value memory 36. The current and next signal value memories 35 and 36 contain logic signal representations. The data in current signal value memory 35 are the logic signal values that are currently present in simulation. The logic unit updates those values, placing the results in the next signal value memory.

The process of updating all of the signal values is called a major cycle. The simulation proceeds in units of major cycles, each of which corresponds to a single gate delay. At the conclusion of each major cycle, the logic simulator machine may halt. If it does not, the former next signal value memory is designated to be the current signal value memory and another major cycle is performed.

Another component of the basic processor of FIG. 2 is the instruction memory 202. The logic unit 34 uses the instruction memory 202 in computing updated logic signal values.

Each logic simulator machine instruction contains a function code field, referred to as the opcode, and address fields. The function code specifies the logic function to be performed, e.g., AND, NOR, XOR, etc. The address fields specify input connections to a gate.

To perform a major cycle, the logic unit 34 sequences through instruction memory 202 in address order, executing each instruction by computing the specified logic function on the specified address fields from current signal memory. The result of each instruction is placed in next signal value memory 36 at the address equal to the instruction's address in instruction memory. Thus, an instruction (representing a gate) at address X has its result (representing the gate's output) placed at next signal value memory 36 address X. The gate's output one gate delay earlier resides at current signal value memory 35 address X.

The logic functions specified in the logic simulator machine instructions are defined by the contents of another basic processor memory, the function memory 37 shown in FIG. 2. Each distinct logic function used in a basic processor during a simulation is defined by the contents of a single location in function memory 37. The function code of each instruction is stored at an address in function memory 37.

Figure 3:
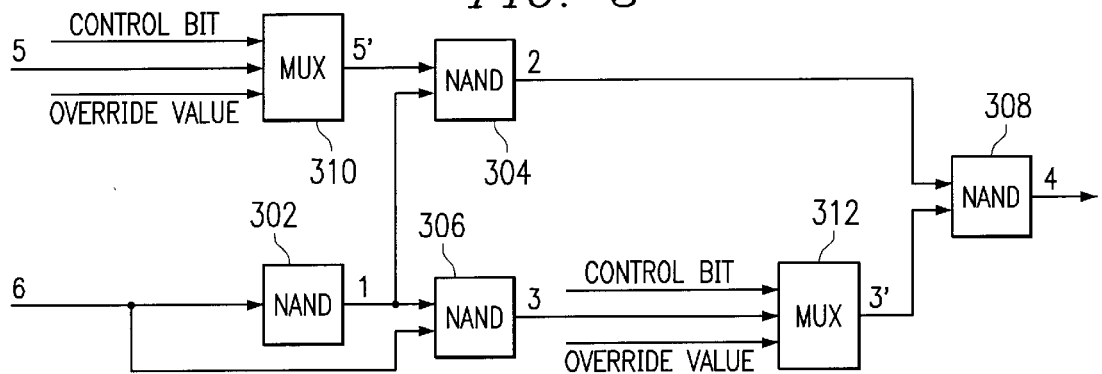
FIG. 3 illustrates a logical representation of a model in accordance with the present invention.

The functions represented in FIGS. 1 and 3, i.e. the NAND functions, are each stored in a separate memory location in function memory 37. Therefore, when the logic simulator machine is executing a test routine using the model of either FIG. 1 or FIG. 3, in order to compute the value for net 1, for example, the function for that net is retrieved from function memory 37. In this example, the function "NAND" will be retrieved. The inputs into the function are also retrieved. The value of this net is then determined using the inputs and the function retrieved from memory.

FIG. 3 illustrates a logical representation of a model in accordance with the present invention. When the present invention is utilized to override a net value, the original functions are left in the function memory unmodified. A multiplexer is inserted into the model for each net whose value might possibly need to be overridden. For example, FIG. 3 depicts a multiplexer 310 and a multiplexer 312. Multiplexer 310 has been added to the model to be utilized in case a test engineer decides net 5 should be overridden. Multiplexer 312 has been added to be utilized in case a test engineer decides net 3 should be overridden. Each multiplexer receives an override value using the override value bit input. The override value is a single bit and will be either a logical one or a logical zero. Each multiplexer also receives a control bit input. The control bit is a single bit, either a logical one or a logical zero. The multiplexers also receive the actual net values. Multiplexer 310 receives the actual net value for net 5. Multiplexer 312 receives the actual net value for net 3.

Each multiplexer will select either the actual net value or the override value and then output one of these values as the output of the multiplexer based on the current state of the control bit. Therefore, multiplexer 310 receives the actual net value for net 5 and an override value. The control bit for multiplexer 310 will control whether the actual net value for net 5 or the override value is output and propagated as the current net 5 value. When the control bit is set, multiplexer 310 will output the override value. This override value will then be propagated to the other nets which use net 5 as an input. When the control bit is cleared, multiplexer 310 will output the actual net value for net 5. The actual net value for net 5 will then be propagated to the other nets which use net 5 as an input.

Similarly, the control bit for multiplexer 312 will control whether the actual net value for net 3 or the override value is output and propagated as the current net 3 value. When the control bit is set, multiplexer 312 will output the override value. This override value will then be propagated to the other nets which use net 3 as an input. When the control bit is cleared, multiplexer 312 will output the actual net value for net 3. The actual net value for net 3 will then be propagated to the other nets which use net 3 as an input.

In operation, if a test engineer decides net 5 is to be overridden, an override value is selected and input into multiplexer 310 using the override value input. The control bit input into multiplexer 310 is then set in order to cause multiplexer 310 to output the override value and to propagate the override value to the nets which use net 5 as an input.

If a test engineer subsequently decides net 5 is not to be overridden, the control bit input into multiplexer 310 is then cleared. Multiplexer 310 then outputs and propagates the actual value of net 5.

Figure 4:
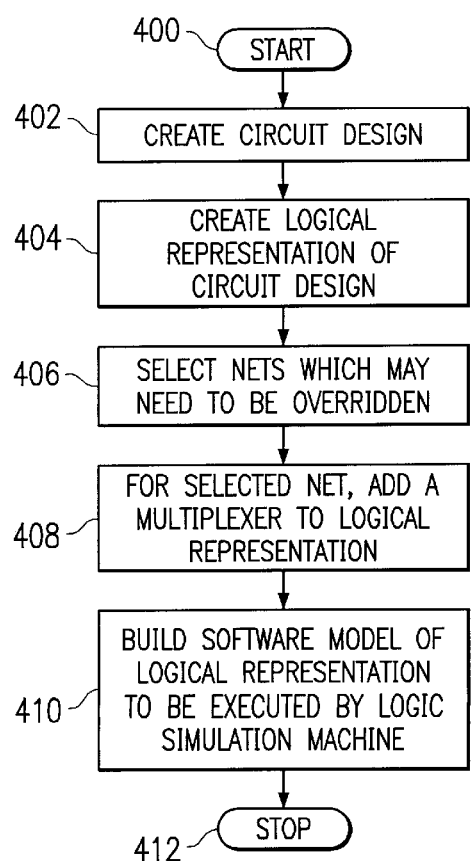
FIG. 4 is a high level flow chart which depicts building a model including multiplexers for nets whose values might be overridden during execution by a logic simulator machine in accordance with the present invention.

FIG. 4 is a high level flow chart which depicts building a model including multiplexers for nets whose values might be overridden during execution by a logic simulator machine in accordance with the present invention. The process starts as illustrated by block 400 and thereafter passes to block 402 which depicts creating a circuit design. This circuit design is to be tested using a logic simulator machine. Next, block 404 illustrates creating a logical representation of the circuit design. The process then passes to block 406 which depicts selecting nets in the logical representation which may need to be overridden during testing. Thereafter, block 408 illustrates adding a multiplexer to the logical representation for each selected net. Block 410, then, depicts building a model of the logical representation, including the multiplexers, to be executed by the logic simulator machine. The process then terminates as illustrated by block 412.

Figure 5:
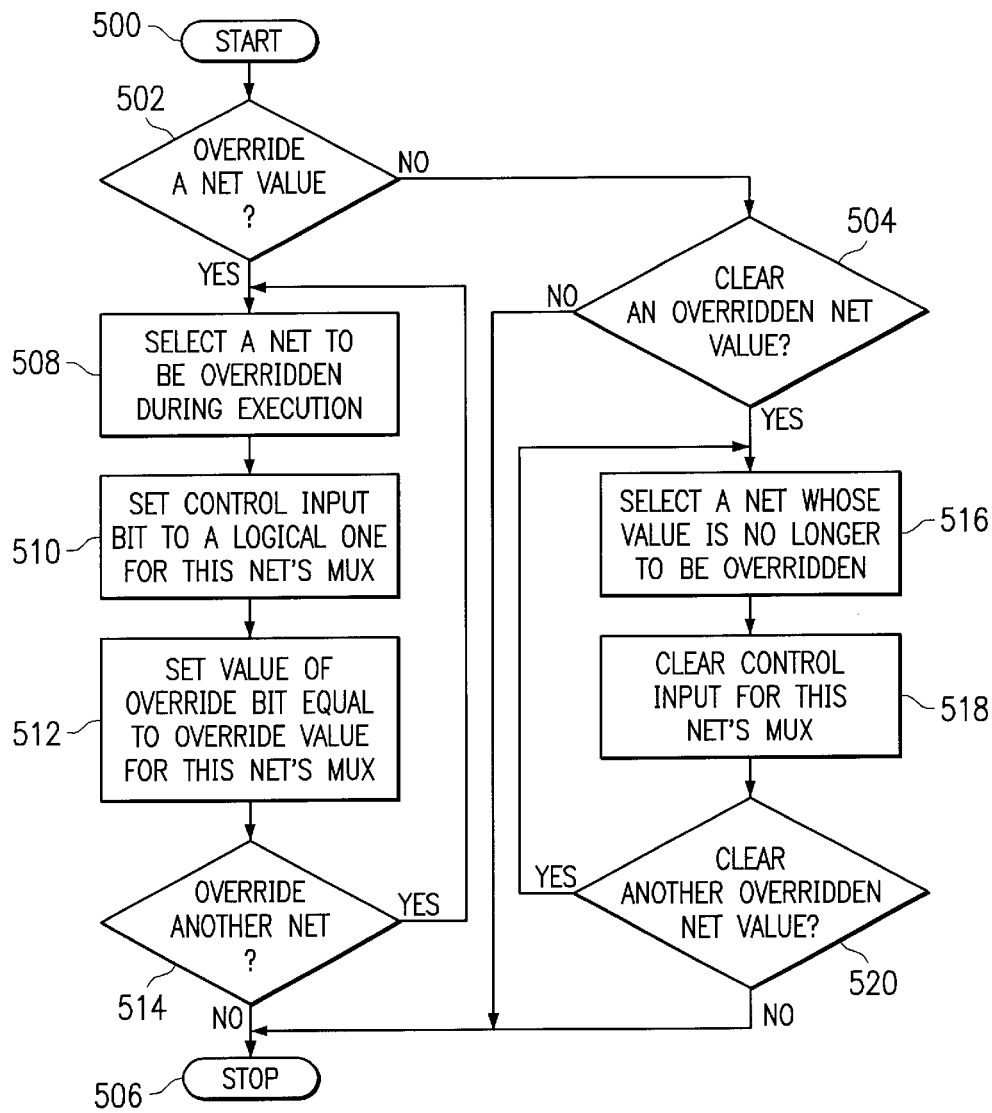
FIG. 5 is a high level flow chart which depicts setting and clearing control bits for selected nets in accordance with the present invention.

FIG. 5 is a high level flow chart which illustrates setting and clearing control bits for selected nets in accordance with the present invention. The process starts as depicted by block 500 and thereafter passes to block 502 which illustrates a determination of whether or not a net's value is to be overridden. If a determination is made that a net's value is not to be overridden, the process passes to block 504 which depicts a determination of whether or not an override bit for a net is to be cleared such that the actual value of the net is propagated instead of the override value. If a determination is made that there is no net whose override bit is to be cleared, the process terminates as illustrated by block 506.

Referring again to block 502, if a determination is made that a net's value is to be overridden, the process passes to block 508 which depicts selecting a net whose value is to be overridden during execution of the test routine. Next, block 510 illustrates setting the value of the control bit in the net's MUX equal to a logical one. Thereafter, block 512 depicts setting the value of the override value bit in the net's MUX equal to the override value. The override value will be either a logical zero or a logical one.

If a plurality of nets are to be simultaneously overridden, the data for the control bit and override bit for each of the nets may be stored contiguously in memory in the model. Therefore, the control bits and override bits for all of the selected nets may be set by copying the control bit and override value bit values into contiguous memory locations in the model. This data may be copied using a single block write command.

Next, block 514 illustrates a determination of whether or not another net is to have its value overridden during execution of a test routine. If a determination is made that another net is to have its value overridden, the process passes back to block 508. Referring again to block 514, if a determination is made that no other net is to have its value overridden, the process terminates as depicted by block 506.

Referring again to block 504, if a determination is made that there is a net whose override bit is to be cleared such that the actual value for the net will be propagated instead of the override value, the process passes to block 516 which illustrates selecting a net whose value is no longer to be overridden. Thereafter, block 518 depicts clearing the control bit in the MUX for the selected net. The control bit is thus set equal to a logical zero. Next, block 520 illustrates a determination of whether or not there is another net which is the have its override bit cleared. If a determination is made that there is another net which is to have its override bit cleared, the process passes back to block 516. Referring again to block 520, if a determination is made that there is no other net which is to have its override bit cleared, the process terminates as depicted by block 506.

Figure 6:
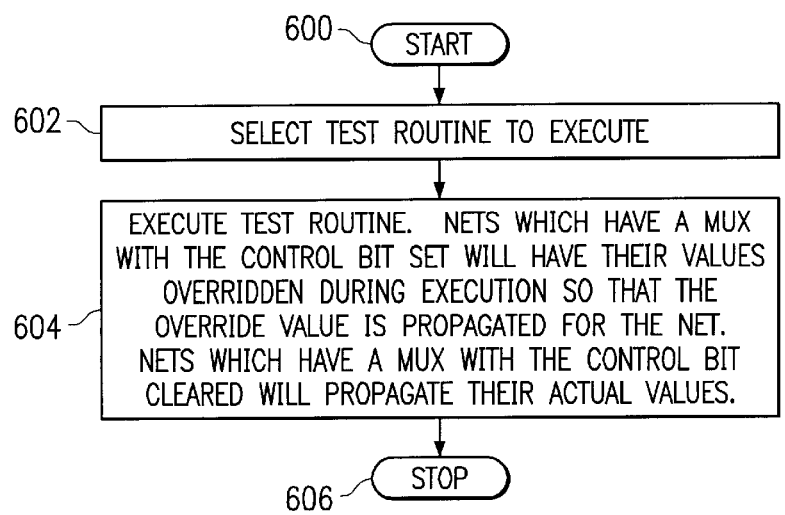
FIG. 6 is a high level flow chart which depicts executing a test routine utilizing a model built for execution by a logic simulator machine in accordance with the present invention.

FIG. 6 is a high level flow chart which depicts executing a test routine utilizing a model built for execution by a logic simulator machine in accordance with the present invention. The process starts as illustrated by block 600 and thereafter passes to block 602 which depicts selecting a test routine to execute to test a circuit design. Next, block 604 illustrates executing the test routine. Nets which have a MUX with the control bit set equal to a logical one will have their actual values overridden during execution so that an override value will be propagated for the net instead of the net's actual value. The constant override value which will be propagated is the value input into the MUX using the override value input. Nets which have a MUX with the control bit cleared, i.e. set equal to a logical zero, will propagate their actual values. The process then terminates as depicted by block 606.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a logic simulator machine for overriding a value of a net during execution of a test routine, said method comprising the steps of:

building a model of a logic design to be simulated utilizing said logic simulator machine, said logic design including a plurality of nets;

selecting one of said plurality of nets whose actual value may be overridden;

inserting a multiplexer into said model during said step of building, said multiplexer receiving as its inputs said actual value of said one of said plurality of nets, a control bit, and an override value, and outputting a current value of said one of said plurality of nets, wherein said current value is propagated to other ones of said plurality of nets; and propagating said override value as said current value of said one of said plurality of nets instead of said actual value throughout execution of said test routine utilizing said multiplexer when said control bit is set.

2. The method according to claim 1, further comprising the steps of:

setting said control bit when said actual value is to be overridden; and clearing said control bit when said actual value is to be propagated as said current value of said one of said plurality of nets.

3. The method according to claim 1, further comprising the steps of:

selecting a first one and a second one of said plurality of nets whose actual value may be overridden;

inserting a first multiplexer into said model for said first one of said plurality of nets, said first multiplexer receiving as its inputs an actual value of said first one of said plurality of nets, a control bit, and an override value, and outputting a current value of said first one of said plurality of nets, wherein said current value is propagated to other ones of said plurality of nets;

inserting a second multiplexer into said model for said second one of said plurality of nets, said second multiplexer receiving as its inputs an actual value of said second one of said plurality of nets, a control bit, and an override value, and outputting a current value of said second one of said plurality of nets, wherein said current value is propagated to other ones of said plurality of nets;

propagating said override value as said current value of said first one of said plurality of nets instead of said actual value throughout execution of said test routine utilizing said first multiplexer when said control bit is set; and propagating said override value as said current value of said second one of said plurality of nets instead of said actual value throughout execution of said test routine utilizing said second multiplexer when said control bit is set.

4. The method according to claim 3, further comprising the steps of:

determining that said actual value of said first one of said plurality of nets is to be overridden and determining that said actual value of said second one of said plurality of nets is not to be overridden;

setting said control bit input into said first multiplexer, wherein said first multiplexer will output said override value input into said first multiplexer; and clearing said control bit input into said second multiplexer, wherein said second multiplexer will output said actual value input into said second multiplexer, and wherein only determined ones of said plurality of nets are overridden.

5. The method according to claim 1, further comprising the steps of:

executing said test routine;

determining whether said control bit is set;

in response to a determination that said control bit is set, propagating said override value as said current value of said one of said plurality of nets; and in response to a determination that said control bit is cleared, propagating said actual value as said current value of said one of said plurality of nets.

6. The method according to claim 1, further comprising the steps of:

selecting a plurality of said plurality of nets whose actual values are to be overridden; and setting a control bit and an override bit in a multiplexer for each of said plurality of said plurality of nets by simultaneously copying data to set each said control bit and each said override bit into contiguous memory in said model.

7. A logic simulator machine for overriding a value of a net during execution of a test routine, comprising:

a model of a logic design to be simulated utilizing said logic simulator machine, said logic design including a plurality of nets;

a multiplexer inserted into said model, said multiplexer receiving as its inputs an actual value of one of said plurality of nets, a control bit, and an override value, and outputting a current value of said one of said plurality of nets, wherein said current value is propagated to other ones of said plurality of nets; and said multiplexer propagating said override value as said current value of said one of said plurality of nets instead of said actual value throughout execution of said test routine when said control bit is set.

8. The logic simulator machine according to claim 7, further comprising:

said control bit being set when said actual value is to be overridden; and said control bit being cleared when said actual value is to be propagated as said current value of said one of said plurality of nets.

9. The logic simulator machine according to claim 7, further comprising:

a first multiplexer inserted into said model for a first one of said plurality of nets, said first multiplexer receiving as its inputs an actual value of said first one of said plurality of nets, a control bit, and an override value, and outputting a current value of said first one of said plurality of nets, wherein said current value is propagated to other ones of said plurality of nets;

a second multiplexer inserted into said model for a second one of said plurality of nets, said second multiplexer receiving as its inputs an actual value of said second one of said plurality of nets, a control bit, and an override value, and outputting a current value of said second one of said plurality of nets, wherein said current value is propagated to other ones of said plurality of nets;

said first multiplexer propagating said override value as said current value of said first one of said plurality of nets instead of said actual value throughout execution of said test routine when said control bit is set; and said second multiplexer propagating said override value as said current value of said second one of said plurality of nets instead of said actual value throughout execution of said test routine when said control bit is set.

10. The logic simulator machine according to claim 9, further comprising:

said control bit input into said first multiplexer being set, wherein said first multiplexer will output said override value input into said first multiplexer; and said control bit input into said second multiplexer being cleared, wherein said second multiplexer will output said actual value input into said second multiplexer, and wherein only determined ones of said plurality of nets are overridden.

11. The logic simulator machine according to claim 7, further comprising:

said logic simulator machine for executing said test routine;

said multiplexer determining whether said control bit is set;

in response to a determination that said control bit is set, said multiplexer selecting said override value to output as said current value of said one of said plurality of nets; and in response to a determination that said control bit is cleared, said multiplexer selecting said actual value to output as said current value of said one of said plurality of nets.

12. The logic simulator machine according to claim 7, further comprising means for setting a control bit and an override bit in a multiplexer for each of said plurality of said plurality of nets by simultaneously copying data to set each said control bit and each said override bit into contiguous memory in said model.

* * * * *